(12) United States Patent
Levin et al.

(10) Patent No.: US 11,366,072 B2
(45) Date of Patent: Jun. 21, 2022

(54) DETECTING BACKSCATTERED ELECTRONS IN A MULTIBEAM CHARGED PARTICLE COLUMN

(71) Applicant: Applied Materials Israel Ltd., Rehovot (IL)

(72) Inventors: Jacob Levin, Rehovot (IL); Alon Litman, Nes-Ziona (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/866,329

(22) Filed: May 4, 2020

(65) Prior Publication Data

US 2021/0341398 A1 Nov. 4, 2021

(51) Int. Cl.
*H01J 37/244* (2006.01)
*G01N 23/203* (2006.01)

(52) U.S. Cl.
CPC .......... *G01N 23/203* (2013.01); *H01J 37/244* (2013.01); *G01N 2223/6116* (2013.01)

(58) Field of Classification Search
CPC ........... G01N 23/203; G01N 2223/6116; H01J 2237/24465; H01J 2237/24475; H01J 37/344

USPC ........................................................ 250/307
See application file for complete search history.

(56) References Cited

U.S. PATENT DOCUMENTS

| | | | |
|---|---|---|---|
| 7,244,932 B2 * | 7/2007 | Nakasuji | G01N 23/225 |
| | | | 250/306 |
| 7,947,951 B2 | 5/2011 | Khursheed | |
| 9,520,266 B2 * | 12/2016 | Shirahata | H01J 37/222 |
| 9,741,532 B1 | 8/2017 | Bedell et al. | |
| 10,236,156 B2 * | 3/2019 | Ren | H01J 37/28 |
| 10,325,753 B2 | 6/2019 | Masnaghetti et al. | |
| 10,347,460 B2 * | 7/2019 | Zhao | H01J 37/222 |
| 10,366,862 B2 | 7/2019 | Masnaghetti et al. | |
| 10,460,905 B2 * | 10/2019 | McCord | H01J 37/045 |
| 10,811,222 B2 * | 10/2020 | Ren | H01J 37/20 |
| 2004/0079883 A1 | 4/2004 | Sugiura et al. | |
| 2010/0320382 A1 | 12/2010 | Almogy et al. | |
| 2015/0155134 A1 | 6/2015 | Frisien et al. | |
| 2019/0172677 A1 * | 6/2019 | Ren | H01J 37/153 |
| 2019/0378681 A1 | 12/2019 | Stejskal et al. | |
| 2021/0193433 A1 * | 6/2021 | Ren | H01J 37/20 |
| 2022/0068594 A1 * | 3/2022 | Mack | G06T 5/002 |

* cited by examiner

*Primary Examiner* — Wyatt A Stoffa
(74) *Attorney, Agent, or Firm* — Kilpatrick Townsend & Stockton LLP

(57) ABSTRACT

A method and a system for detecting backscattered electrons in a multi-beam electron column.

16 Claims, 8 Drawing Sheets

DETECTING BACKSCATTERED ELECTRONS IN A MULTIBEAM CHARGED PARTICLE COLUMN

BACKGROUND

A multi-beam electron column (hereinafter—"column") irradiates a sample with multiple primary electron beams and detects beamlets of secondary electrons and additionally or alternatively beamlets of backscattered electrons that are emitted from the sample.

In the column, the secondary electrons are usually collected by an extraction field from the sample surface, pass through some electron-optical elements and eventually are focused on a plane that is perpendicular to path of the secondary electrons.

The spatial separation between the secondary electrons on the detector plane is essential for the operation of the column as a high throughput inspection device since the collected information from each beamlet must be independent.

Cross talk between the detected signals from different beamlets reduces the detection sensitivity and may lead to false detection. Therefore the minimal distance between beamlets in the column is limited by the ability of the detection system to minimize the cross talk between the detected signals.

In many applications it is the backscattered electrons (BSE) signal which carries the relevant information for defect inspection. BSE may be regarded as emitted electrons with energy above 50 eV.

However, the detection of BSE with minimal cross talk between beamlets poses a great challenge on conventional schemes of columns. The main reason for the difficulty to separate BSE from different beamlets is the large energy range of the BSE. For example, at primary energy of 3 keV the BSE may range between 50 eV to 3 keV with a relatively flat distribution and no preference to any smaller energy subrange—which mandates a collection of BSE within the entire range.

BSE with different energies focus at different focal points—located at different distances from the sample. A detector that is normal to the paths of the BSE will be adapted to efficiently collect BSE from only a small fraction of the large energy range of the BSE and will suffer from crosstalk with BSE electrons from neighboring beamlets.

There is a growing need to provide an efficient method for detecting BSE in multi-beam electron columns.

SUMMARY

There may be provided a method and a system for detecting BSE in multi-beam electron columns.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
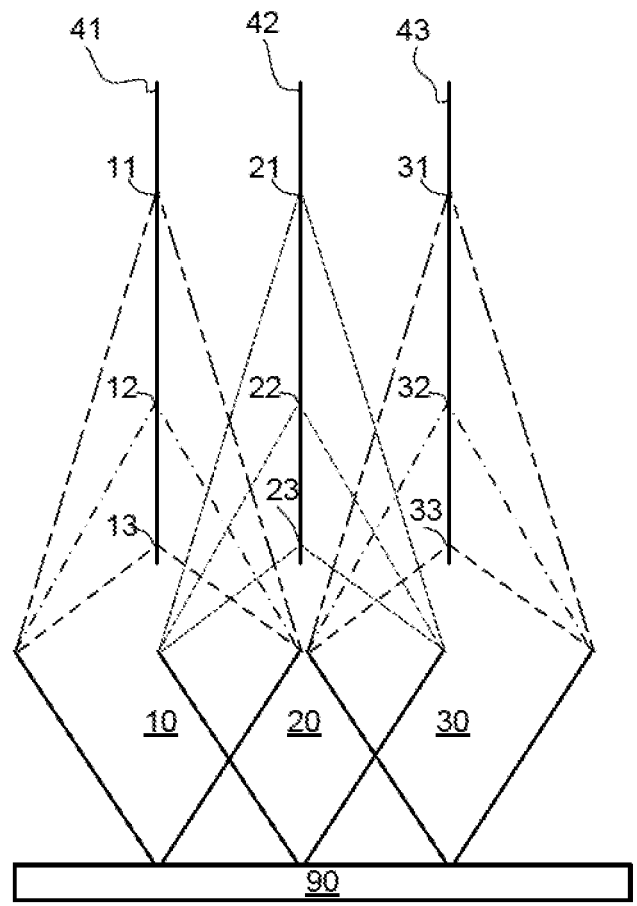
FIG. 1 illustrates an example of a part of a system, a substrate, three beamlets, and three BSE detectors.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

There may be provided a system and a method for detecting BSE in a multi-beam electron column. The multi-beam electron column may belong to a scanning electron microscope, to an imaging system that is not a scanning electron microscope, to a scanning transmission electron microscope, and the like.

The system and the method may be used to illuminate a substrate. The substrate may be a wafer, a MEMS substrate, a solar panel, a lithographic mask, and the like.

In various examples it will be assumed, for simplicity of explanation, that the substrate is a wafer.

In order to overcome the inherent difficulty that stems from the large energy range of BSE which results in an inability to define a unique detector plane within the electron optics of the column, there is provided a system and method for detecting BSE in multi-beam electron columns, using one or more three dimensional detectors that may be positioned along the geometrical position in space where BSE of different energies within a large energy range are focused. In such a scheme—BSE of the different energies can be collected. Each detector may also be thin—thereby reducing the cross talk between BSE beamlets.

FIG. 1 illustrates a part 98 of a system, wafer 90, three beamlets of BSE (first BSE beamlet 10, second BSE beamlet 20 and third BSE beamlet 30), and three BSE detectors.

FIG. 1 also illustrates examples of focal points of BSE of different energies.

First focal point 11 is the focal point of first BSE that have a first energy. First focal point 11 belongs to first BSE beamlet 10. Second focal point 12 is the focal point of second BSE that have a second energy. Second focal point 12 belongs to first BSE beamlet 10. Third focal point 13 is the focal point of third BSE that have a third energy. Third focal point 13 belongs to first BSE beamlet 10.

The first BSE detector 41 is located at focal points of BSE of the first BSE beamlet 10 and is configured to collect BSE of the first BSE beamlet at different focal point locations—including first focal point 11, second focal point 12 and third focal point 13.

Fourth focal point 21 is the focal point of fourth BSE that have a first energy. Fourth focal point 21 belongs to second BSE beamlet 20. Fifth focal point 22 is the focal point of fifth BSE that have a second energy. Fifth focal point 22 belongs to second BSE beamlet 20. Sixth focal point 23 is the focal point of sixth BSE that have a third energy. Sixth focal point 23 belongs to second BSE beamlet 20.

The second BSE detector 42 is located at focal points of BSE of the second BSE beamlet 20 and is configured to collect BSE of the second BSE beamlet at different focal point locations—including at fourth focal point 21, at fifth focal point 22 and at sixth focal point 23.

Seventh focal point 31 is the focal point of seventh BSE that have a first energy. Seventh focal point 31 belongs to third BSE beamlet 30. Eighth focal point 32 is the focal point of eighth BSE that have a second energy. Eighth focal point 32 belongs to third BSE beamlet 30. Ninth focal point 33 is the focal point of ninth BSE that have a third energy. Ninth focal point 33 belongs to third BSE beamlet 30.

The third BSE detector 43 is located at focal points of BSE of the third BSE beamlet 30 and is configured to collect BSE of the third BSE beamlet at different focal point locations—including at seventh focal point 31, at eighth focal point 32 and at ninth focal point 33.

Figure 2:
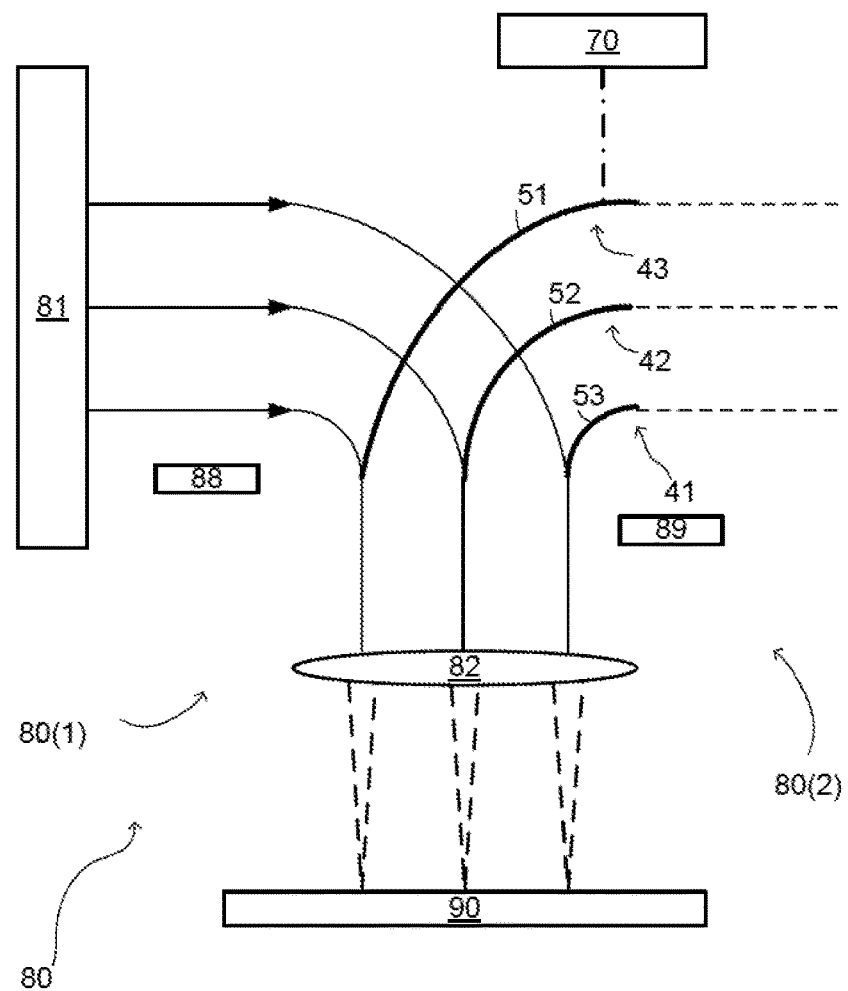
FIG. 2 illustrates a substrate and a system.
Figure 3:
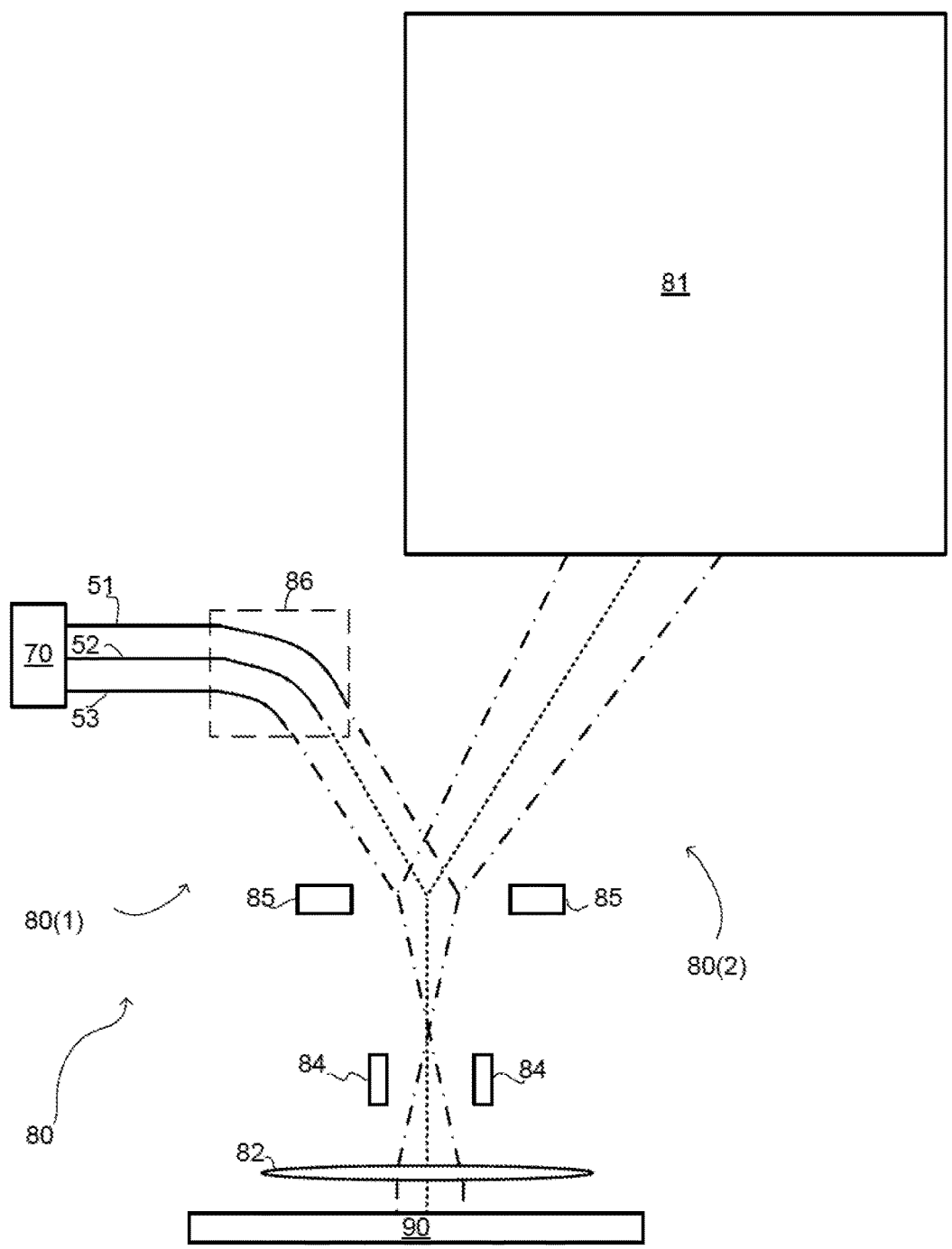
FIG. 3 illustrates a substrate and a system.

In FIGS. 2-3 a wire shaped BSE detector is used per each BSE beamlet. The wire shaped detector can be, for example, a fiber that is coated by a scintillator, or a rod made of scintillating material etc.

The wire shaped BSE detector may be positioned along the line in space (or a curve in space) which is defined by the points where BSE of different energies of a given BSE beamlet are focused. The wire shaped BSE detector may be as narrow as possible to collect only focused electrons and reduce the cross talk.

In various multi-beam electron column the BSE beamlets are separated from the primary beam by a deflection system. Such deflection will usually be chromatic (i.e. energy dependent) and/or may include bending the path of the BSE beamlets—and may result in corresponding shapes of the BSE detectors. The BSE detectors will be positioned along well-defined geometrical lines in space on which the BSEs of BSE beamlets will be focused.

In FIGS. 2-3 at least a part of a BSE detector is curved—following the curved path formed by focus points of BSE of different energies along the path of propagation of the BSE beamlets.

FIG. 2 illustrates wafer 90 and system 99.

System 99 may include multi-beam electron column 80. The multi-beam electron column 80 may include:

An illumination unit 80(1) that is configured to illuminate a sample with multiple primary electron beams.

A collection unit 80(2) that is configured to collect multiple beamlets of backscattered electrons that are emitted from the sample, the multiple beamlets of backscattered electrons comprise backscattered electrons having energies within an energy range of a width of at least one thousand electron volts.

Multiple spaced apart backscattered electron detectors that are configured to detect the multiple beamlets of backscattered electrons Each backscattered electron detector is allocated to a dedicated beamlet of backscattered electrons and is positioned at a position that corresponds to points of focus of backscattered electrons that belong to the dedicated beamlet and are of different energies within the energy range.

The illumination unit 80(1) is illustrated as including primary electron beams source 81, additional primary electron beams optics 88 (such as deflecting and/or bending optics), and objective lens 82.

The collecting unit 80(2) is illustrated as including objective lens 82 and additional collection optics 89 (such as deflecting and/or bending optics).

The multiple spaced apart backscattered electron detectors include first BSE detector 51, second BSE detector 52 and third BSE detector 53.

The detection signals generated by the first BSE detector 51, the second BSE detector 52 and the third BSE detector 53 are fed to a processing unit 70.

The processing unit 70 may include one or more processing circuits such as microprocessors, graphic processing units, hardware accelerators, central processing units, neural network processors, image processors, and the like. The processor may be programmed (or otherwise constructed and arranged to, or configured to) execute any step of any of the method illustrated in the specification.

System 99 may include a memory unit (not shown) that may be a volatile or non-volatile memory unit, may be configured to store information (such as images), and/or instructions. The memory unit is an example of a non-transitory computer readable medium.

The collection unit 80(2) may be configured to induce the different multiple beamlets of backscattered electrons to propagate towards the first BSE detector 51, the second BSE detector 52 and the third BSE detector 53.

The backscattered electrons that belong to the dedicated beamlet and are of different energies within the energy range are spread across an entirety of the energy range. Accordingly—each one of the first BSE detector 51, the second BSE detector 52 and the third BSE detector 53 may detect BSE having any value within the possible ranges of energy of BSE of such beamlets.

Each one of the first BSE detector 51, the second BSE detector 52, and the third BSE detector 53 may be substantially parallel to a propagation direction of backscattered electrons that belong to a dedicated beamlet allocated to the backscattered electron detector.

The collection unit 80(2) is configured to bend a path of the multiple beamlets of backscattered electrons. Each one of the first BSE detector 51, the second BSE detector 52 and the third BSE detector 53 has a bended segment that corresponds to the bending.

Each one of the first BSE detector 51, the second BSE detector 52 and the third BSE detector 53 may be a wire—or may have a shape that differs from a wire shaped detector.

A width of a traverse cross section of each of the first BSE detector 51, the second BSE detector 52 and the third BSE detector 53 may be very small—for example it may be less than one percent of a distance between adjacent backscattered electron detector. The traverse cross section may be taken along a plane that is perpendicular to the longitudinal axis of the BSE detector.

FIG. 3 illustrates wafer 90 and system 97.

System 97 may include multi-beam electron column 80. The multi-beam electron column 80 may include:

An illumination unit 80(1) that is configured to illuminate a sample with multiple primary electron beams.

A collection unit 80(2) that is configured to collect multiple beamlets of backscattered electrons that are emitted from the sample, the multiple beamlets of backscattered electrons comprise backscattered electrons having energies within an energy range of a width of at least one thousand electron volts.

Multiple spaced apart backscattered electron detectors that are configured to detect the multiple beamlets of backscattered electrons, each backscattered electron detector is allocated to a dedicated beamlet of backscattered electrons and is positioned at a position that corresponds to points of focus of backscattered electrons that belong to the dedicated beamlet and are of different energies within the energy range.

The illumination unit 80(1) is illustrated as including primary electron beams source 81, additional primary electron beams optics (such as first deflectors 85 and second deflectors 84), and objective lens 82.

The collecting unit 80(2) is illustrated as including objective lens 82 and additional collection optics (such as first deflectors 85, second deflectors 84 and bending optics 86).

The multiple spaced apart backscattered electron detectors include first BSE detector 51, second BSE detector 52 and third BSE detector 53.

The detection signals generated by the first BSE detector 51, the second BSE detector 52 and the third BSE detector 53 are fed to a processing unit 70.

Although FIGS. 1, 2 and 3 illustrate a linear array of three BSE detectors, it should be noted that the number of BSE detector may be two or may exceed three. The BSE detectors may be arranged in a line or in a two dimensional array of any arrangement.

Figure 4:
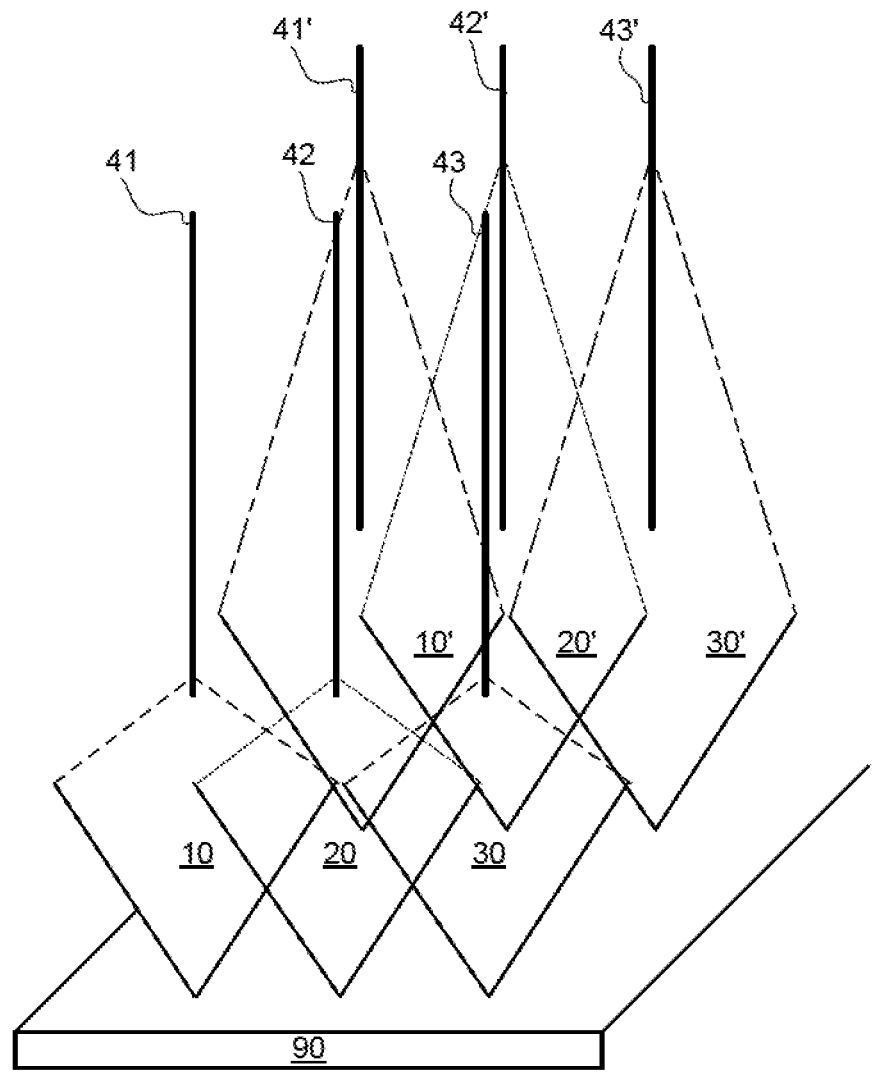
FIG. 4 illustrates an example of a part of a system, a substrate, six beamlets, and six BSE detectors.

FIG. 4 illustrates a part 96 of a system that includes a two dimensional array of BSE beamlets and a two dimensional array of BSE detectors. The two dimensional array of BSE beamlets includes two lines of three BSE beamlets each. The first line includes first BSE beamlet 10, second BSE beamlet 20, and third BSE beamlet 30. The second line includes fourth BSE beamlet 10', fifth BSE beamlet 20', and sixth BSE beamlet 30'.

The two dimensional array of BSE detectors includes a first line of three BSE detectors (that include first BSE detector 41, second BSE detector 42, and third BSE detector 43), the second line of BSE detectors includes three BSE detectors (that include fourth BSE detector 41', fifth BSE detector 42', and sixth BSE detector 43').

Any number of BSE detectors may be provided. An array of BSE detectors may be symmetrical, may be a-symmetrical, may be ordered, may not be ordered, and the like.

Figure 5:
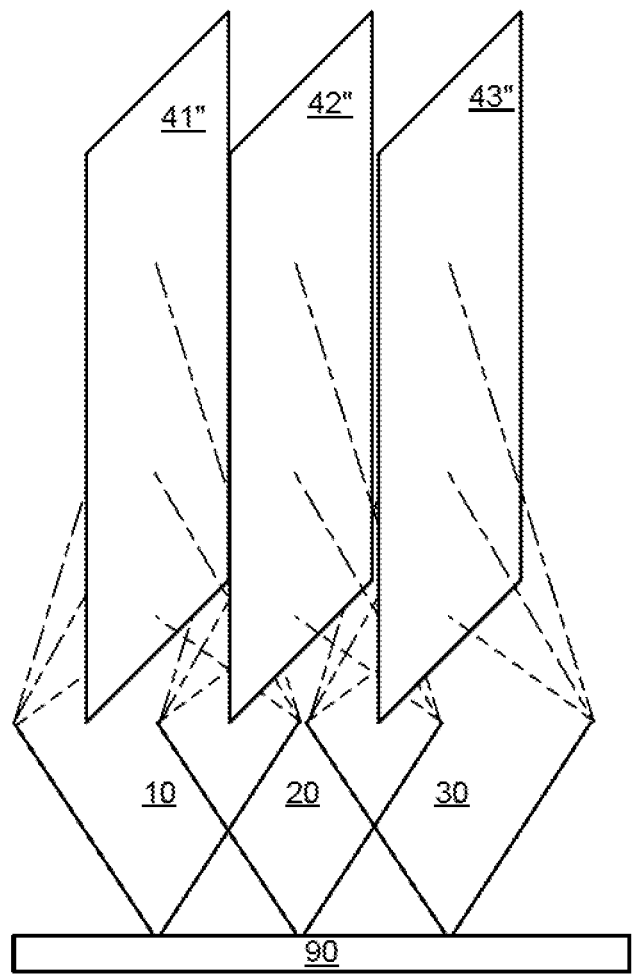
FIG. 5 illustrates an example of a part of a system, a substrate, three beamlets, and three BSE detectors.

FIG. 5 illustrates a part 95 of a system, wafer 90, three beamlets of BSE (first BSE beamlet 10, second BSE beamlet 20 and third BSE beamlet 30), and three BSE detectors (first planar BSE detector 41", second planar BSE detector 42", and third planar BSE detector 43").

FIG. 5 differ from FIG. 1 by having planar BSE detector instead of wire shaped BSE detectors.

Each planar BSE detector has a portion that intersects with well-defined geometrical lines in space on which different BSEs beamlets are focused.

Figure 6:
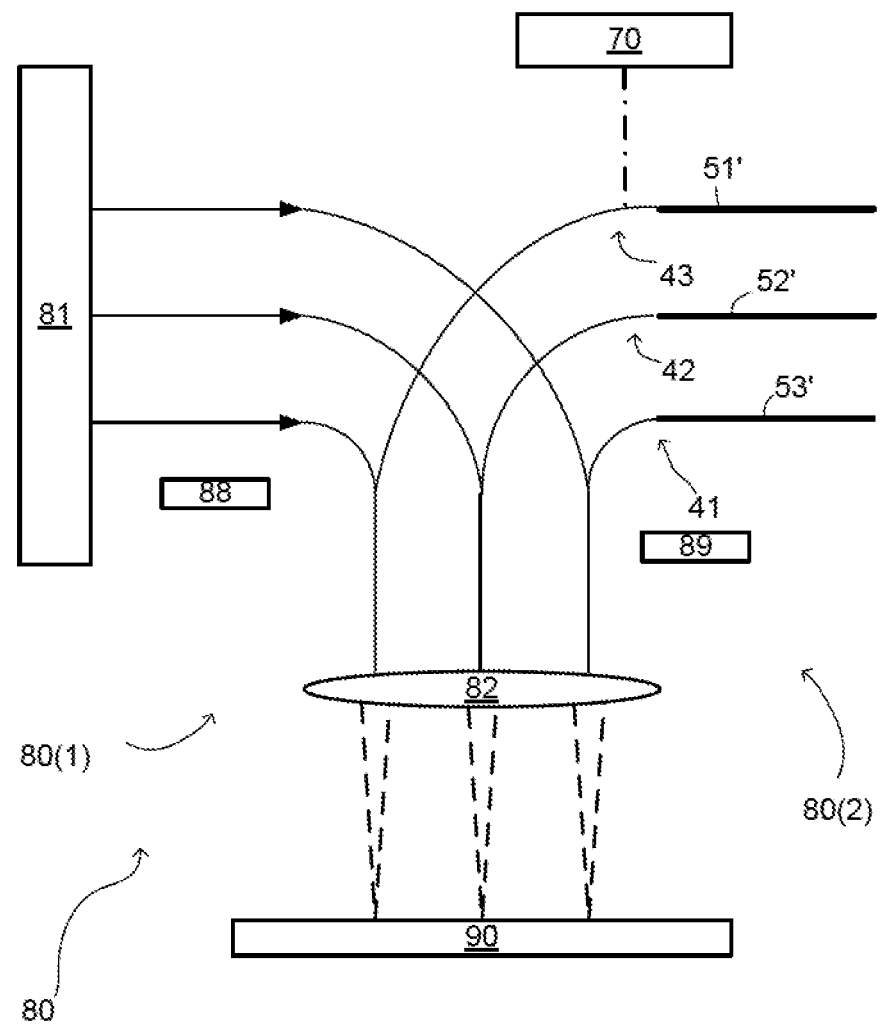
FIG. 6 illustrates a substrate and a system.

FIG. 6 illustrates wafer 90 and system 94. System 94 differs from system 99 of FIG. 2 by the location and shape of the BSE detectors—the first BSE detector 51', second BSE detector 52', and third BSE detector 53' of system 94 are straight wires and more distant from the objective lens 82 than the BSE detectors of system 94.

Figure 7:
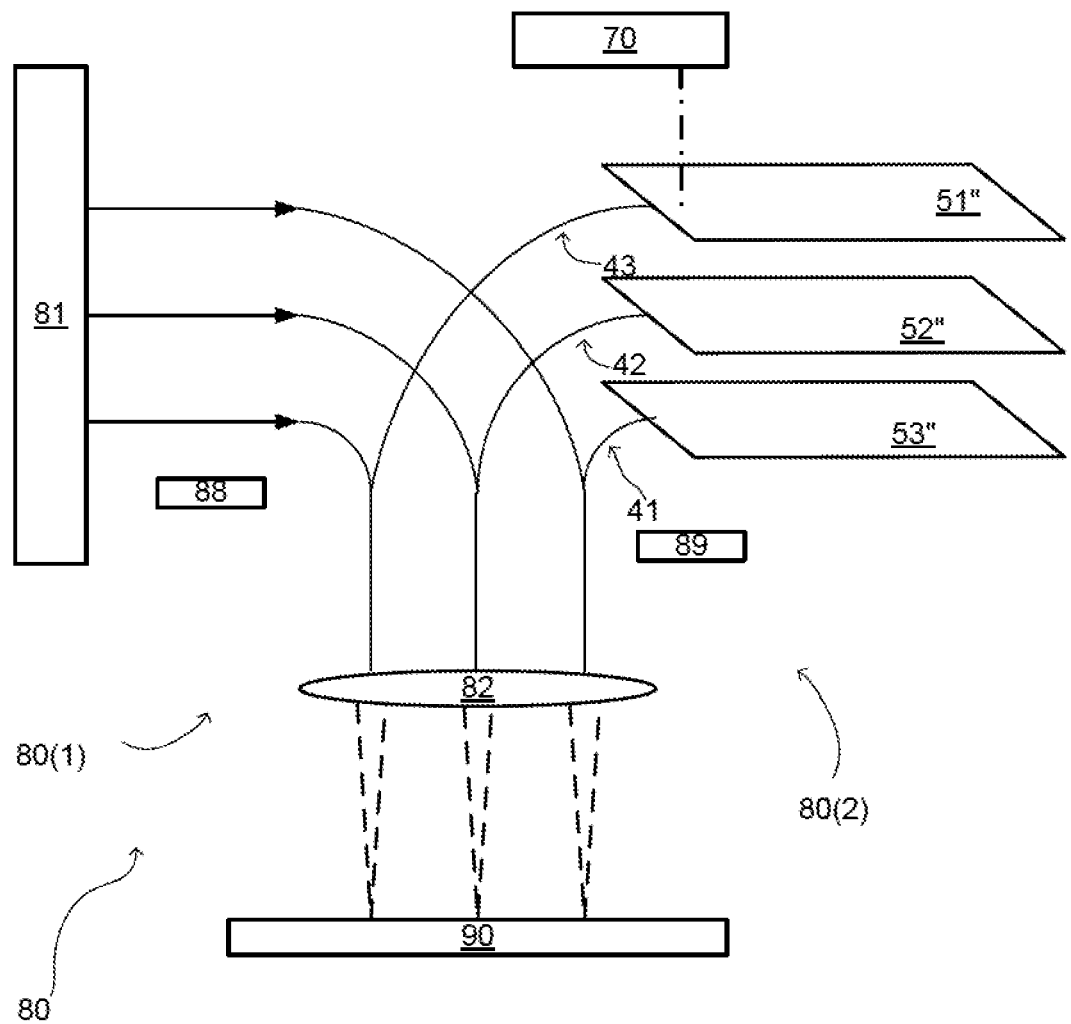
FIG. 7 illustrates a substrate and a system.

FIG. 7 illustrates wafer 90 and system 93. System 93 differs from system 99 of FIG. 2 by the location and shape of the BSE detectors—the first planar BSE detector 51', second planar BSE detector 52', and third planar BSE detector 53' of system 93 are planar and not wires—and more distant from the objective lens 82 than the BSE detectors of system 94.

Figure 8:
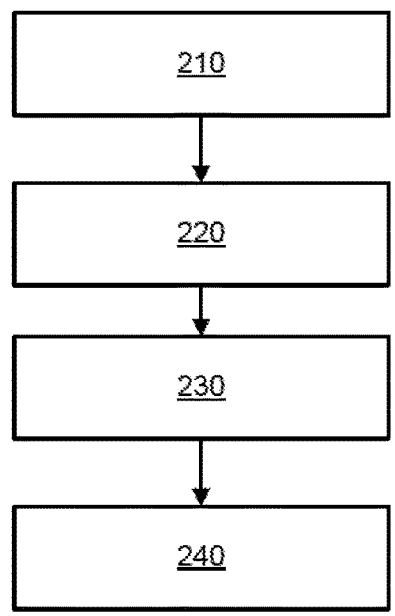
FIG. 8 illustrates an example of a method.

FIG. 8 illustrates method 200 for detecting backscattered electrons in a multi-beam electron column.

Method 300 may start by step 210 of illuminating a sample with multiple primary electron beams. The entire sample or only a part of the sample may be illuminated at once.

Step 210 may be followed by step 220 of collecting multiple beamlets of backscattered electrons that are emitted from the sample, the multiple beamlets of backscattered electrons comprise backscattered electrons having energies within an energy range.

The energy range may have a width of at least twenty percent from an energy of a primary electron beam of the multiple primary electron beam.

The energy range may have a width of at least few hundred volts, for example—at least one thousand electron volts.

Step 220 may include inducing the different multiple beamlets of backscattered electrons to propagate towards the multiple spaced apart backscattered electron detectors.

Step 220 may include bending a path of the multiple beamlets of backscattered electrons by a beam bender, and wherein each backscattered electron detector comprise a bended segment that corresponds to the bending.

Step 220 may be followed by step 230 of detecting the multiple beamlets of backscattered electrons by multiple spaced apart backscattered electron detectors, each backscattered electron detector is allocated to a dedicated beamlet of backscattered electrons and is positioned at a position that corresponds to points of focus of backscattered electrons that belong to the dedicated beamlet and are of different energies within the energy range. The backscattered electrons that belong to the dedicated beamlet are of different energies within the energy range are spread across an entirety of the energy range.

Each backscattered electron detector may be a wire or may differ from a wire.

A width of a traverse cross section of each backscattered electron detector may be less than one percent of a distance between adjacent backscattered electron detector.

Each backscattered electron detector may be substantially parallel to a propagation direction of backscattered electrons that belong to a dedicated beamlet allocated to the backscattered electron detector.

Steps 210, 220, 230 and 240 may be repeated while re-illuminating an area of the sample and/or while illuminating different areas.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

Any combination of any module or unit listed in any of the figures, any part of the specification and/or any claims may be provided. Especially any combination of any claimed feature may be provided.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The foregoing specification, includes specific examples of one or more embodiments. It will, however, be evident that various modifications and changes may be made therein without departing from the broader spirit and scope of the one or more embodiments as set forth in the appended claims.

We claim:

1. A multi-beam electron column, the multi-beam electron column comprises:
   an illumination unit that is configured to illuminate a sample with multiple primary electron beams;
   a collection unit that is configured to collect multiple beamlets of backscattered electrons that are emitted from the sample, each beamlet comprising backscattered electrons having energies within an energy range, the collection unit also configured to separate the multiple beamlets from the multiple primary electron beams, and configured to focus the multiple beamlets so that each beamlet has multiple points of focus along a path of the backscattered electrons, wherein positions of the multiple points of focus depend on the energies of the backscattered electrons; and
   multiple spaced apart backscattered electron detectors that are each configured to detect the backscattered electrons from an associated beamlet, each backscattered electron detector having a detection segment that is positioned to intersect with the multiple points of focus along the path of the backscattered electrons from the associated beamlet.

2. The multi-beam electron column according to claim 1, wherein a width of the energy range exceeds twenty percent of an energy of a primary electron beam of the multiple primary electron beams.

3. The multi-beam electron column according to claim 1, wherein the collection unit is configured to induce the multiple beamlets of backscattered electrons to propagate towards the multiple spaced apart backscattered electron detectors.

4. The multi-beam electron column according to claim 1, wherein the backscattered electrons of each beamlet are spread across an entirety of the energy range.

5. The multi-beam electron column according to claim 1, wherein the detection segment of each backscattered electron detector is substantially parallel to a propagation direction of the backscattered electrons.

6. The multi-beam electron column according to claim 1, comprising a beam bender that is configured to bend a path of the multiple beamlets of backscattered electrons, wherein the detection segment of each backscattered electron detector has a shape that corresponds to the bending.

7. The multi-beam electron column according to claim 1, wherein the detection segment of each backscattered electron detector is a wire.

8. The multi-beam electron column according to claim 1, wherein each backscattered electron detector is a planar backscattered electron detector.

9. The multi-beam electron column according to claim 1, wherein the multiple spaced apart backscattered electron detectors form a two dimensional array of detectors.

10. A method for detecting backscattered electrons in a multi-beam electron column, the method comprises:
    illuminating a sample with multiple primary electron beams;
    collecting multiple beamlets of backscattered electrons that are emitted from the sample, each beamlet comprising backscattered electrons having energies within an energy range;
    separating the multiple beamlets from the multiple primary electron beams;
    focusing the multiple beamlets, each beamlet having multiple points of focus along a path of the backscattered electrons, wherein positions of the multiple points of focus depend on the energies of the backscattered electrons; and
    detecting the multiple beamlets of backscattered electrons using multiple spaced apart backscattered electron detectors that are each configured to detect backscattered electrons from an associated beamlet, each backscattered electron detector having a detection segment that is positioned to intersect with the multiple points of focus along the path of the backscattered electrons from the associated beamlet.

11. The method according to claim 10 wherein a width of the energy range exceeds twenty percent of an energy of a primary electron beam of the multiple primary electron beams.

12. The method according to claim 10, wherein the collecting comprises inducing the multiple beamlets of backscattered electrons to propagate towards the multiple spaced apart backscattered electron detectors.

13. The method according to claim 10, wherein the backscattered electrons of each beamlet are spread across an entirety of the energy range.

14. The method according to claim 10, wherein the detection segment of each backscattered electron detector is substantially parallel to a propagation direction of the backscattered electrons.

15. The method according to claim 10, wherein the collecting comprises bending a path of the multiple beamlets of backscattered electrons by a beam bender, and wherein the detection segment of each backscattered electron detector has a shape that corresponds to the bending.

16. The method according to claim 10, wherein the detection segment of each backscattered electron detector is a wire.

* * * * *